United States Patent
Huang et al.

(10) Patent No.: US 12,519,451 B2
(45) Date of Patent: Jan. 6, 2026

(54) SURFACE ACOUSTIC WAVE DEVICE HAVING ENHANCED POWER DURABILITY

(71) Applicant: SKYWORKS SOLUTIONS, INC., Irvine, CA (US)

(72) Inventors: Yulin Huang, Moriguchi (JP); Gong Bin Tang, Moriguchi (JP); Kyohei Kobayashi, Otsu (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 840 days.

(21) Appl. No.: 17/813,659

(22) Filed: Jul. 20, 2022

(65) Prior Publication Data

US 2023/0026465 A1   Jan. 26, 2023

Related U.S. Application Data

(60) Provisional application No. 63/224,033, filed on Jul. 21, 2021.

(51) Int. Cl.
| | |
|---|---|
| *H03H 9/02* | (2006.01) |
| *H03H 9/10* | (2006.01) |
| *H03H 9/145* | (2006.01) |
| *H03H 9/25* | (2006.01) |
| *H03H 9/64* | (2006.01) |

(52) U.S. Cl.
CPC ...... *H03H 9/02834* (2013.01); *H03H 9/1064* (2013.01); *H03H 9/14544* (2013.01); *H03H 9/25* (2013.01); *H03H 9/64* (2013.01)

(58) Field of Classification Search
CPC ............. H03H 9/02834; H03H 9/1064; H03H 9/14544; H03H 9/25; H03H 9/64; H03H 9/1071
See application file for complete search history.

(56) References Cited

U.S. PATENT DOCUMENTS

| | | | |
|---|---|---|---|
| 10,536,131 B2 | 1/2020 | Goto et al. | |
| 2020/0287518 A1* | 9/2020 | Hashimoto | ............ H03H 9/059 |

* cited by examiner

*Primary Examiner* — Emily P Pham
(74) *Attorney, Agent, or Firm* — Lando & Anastasi, LLP (57) ABSTRACT

Embodiments of the invention relate to a surface acoustic wave device including a piezoelectric substrate, an interdigital transducer electrode on the piezoelectric substrate and a first thermally conductive layer arranged over the piezoelectric substrate and interdigital transducer electrode. The first thermally conductive layer is spaced apart from the piezoelectric substrate and interdigital transducer electrode. The surface acoustic wave device also includes a second thermally conductive layer configured to dissipate heat generated by the surface acoustic wave device. The second thermally conductive layer is arranged on an opposing side of the piezoelectric substrate to the interdigital transducer electrode. Related wafer-level packages, radio frequency modules and wireless communication devices are also provided.

25 Claims, 7 Drawing Sheets

SURFACE ACOUSTIC WAVE DEVICE HAVING ENHANCED POWER DURABILITY

CROSS-REFERENCE TO RELATED APPLICATIONS

This application claims priority under 35 U.S.C. § 119(e) to U.S. Provisional Patent Application Ser. No. 63/224,033, titled "SURFACE ACOUSTIC WAVE DEVICE HAVING ENHANCED POWER DURABILITY," filed Jul. 21, 2021, the entire contents of which is incorporated herein by reference for all purposes.

BACKGROUND

Field

Aspects and embodiments disclosed herein relate to surface acoustic wave devices. More particularly, at least some embodiments are directed to wafer-level packages for surface acoustic wave devices.

Description of the Related Technology

A surface acoustic wave (SAW) filter can include a plurality of resonators arranged to filter a radio frequency signal. Each resonator can include a SAW device. Surface acoustic wave filters can be implemented in radio frequency electronic systems. For instance, filters in a radio frequency front end of a mobile phone can include SAW filters. Two SAW filters can be arranged as a duplexer. Filtering signals having relatively high power levels can generate heat.

A temperature-compensated surface acoustic wave (TC-SAW) filter can include a SAW device that has been adapted to have improved thermal stability. The center frequency of a SAW filter can vary with changes in temperature caused, for example, by heat generated during operation. A TC-SAW filter seeks to minimize variations in the center frequency as temperature changes.

Figure 1:
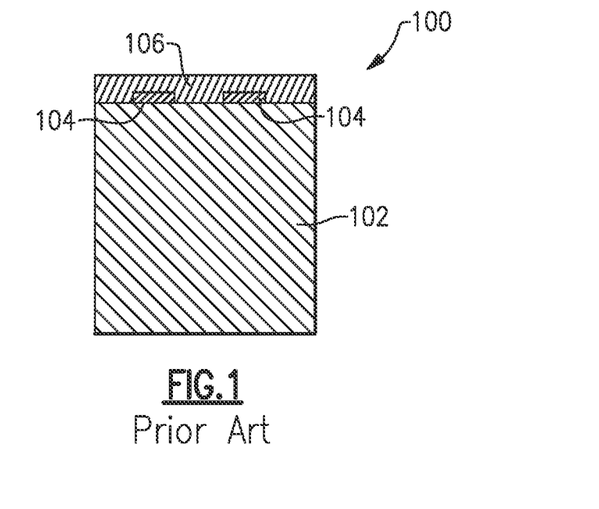
FIG. 1 is a side cross-sectional view of a portion of an exemplary conventional TC-SAW device.

For example, FIG. 1 shows a side cross-sectional view of a portion of a conventional TC-SAW device 100. The TC-SAW device 100 includes a piezoelectric substrate 102 made from lithium niobate and a metal interdigital transducer electrode 104. A temperature-compensation layer 106 of silicon dioxide is arranged over and in contact with the piezoelectric substrate 102 and interdigital transducer electrode 104.

A wafer-level package refers to a integrated circuit that is packaged while still part of a wafer, as opposed to separating the wafer into individual dies and packaging each die separately. The resulting wafer-level package is a chip-scale package because the package is the same size as, or only marginally larger than, the size of the die. The integrated circuit can include a SAW or TC-SAW device.

Figure 2:
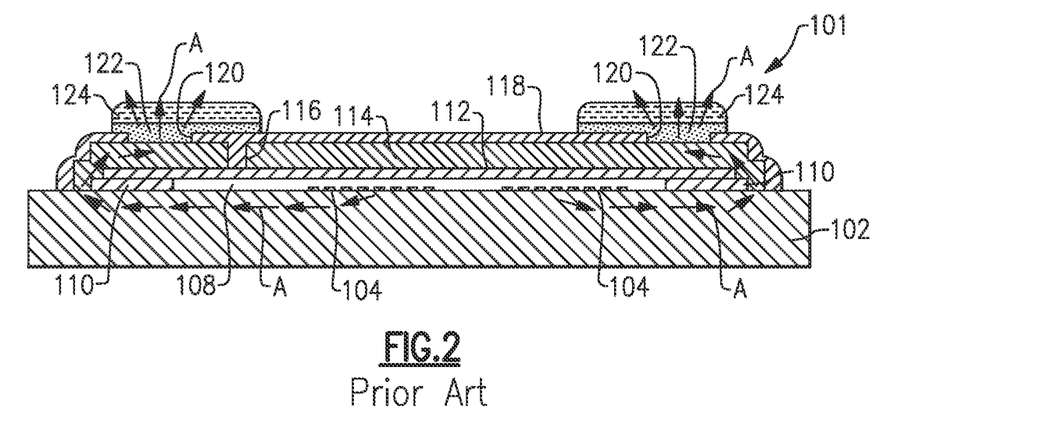
FIG. 2 is a side cross-sectional view of an exemplary conventional wafer-level package including a SAW device.

For example, FIG. 2 shows a side cross-sectional view of a conventional wafer-level package 101. The wafer-level package 101 can include a SAW or TC-SAW device. The wafer-level package 101 includes a piezoelectric substrate 102 formed from lithium niobate and a plurality of metal interdigital transducer electrodes 104. The interdigital transducer electrodes 104 are accommodated within a cavity 108 defined by a cavity wall 110 and a cavity roof 112. The cavity wall 110 is formed on the piezoelectric substrate 102 and encloses an area of the piezoelectric substrate 102 on which the interdigital transducer electrodes 104 and other circuit structures (not shown) are formed. The cavity roof 112 is arranged over the piezoelectric substrate 102 and interdigital transducer electrodes 104 and is supported by the cavity wall 110 such that it is spaced apart from the piezoelectric substrate 102 and interdigital transducer electrodes 104 to create an air gap between the interdigital transducer electrodes 104 and the cavity roof 112.

A copper layer 114 is arranged on top of the cavity roof 112 and cavity wall 110. The copper layer 114 contacts the piezoelectric substrate 102 outside the cavity wall 110 to provide a thermal conduction pathway from the piezoelectric substrate 102 to the copper layer 114. The copper layer 114 can also make electrical contact with circuit structures on the upper side of the piezoelectric substrate 102 and may be patterned by removing portions of the copper layer 114 to form gaps 116 in the copper layer so as to provide specific interconnection pathways between circuit structures. A buffer coat 118 typically comprising a polyimide layer is arranged over the copper layer 114. Holes 120 are formed in the buffer coat 118. Copper terminals 122 are formed over the holes 120. The copper of the copper terminals 122 fills the holes 120 and provides electrical contact to the copper layer 114. Solder bumps 124 are then arranged on the copper terminals 122.

In use, heat is generated by the interdigital transducer electrodes 104. Heat generation is a particular problem when the SAW device is being used at high power. Known SAW devices have limited ability to withstand high power and the fragility of such devices is greatly exacerbated by heat. Furthermore, the design of known SAW wave devices does not allow for efficient dissipation of heat from the device. Poor thermal conductivity of the piezoelectric substrate and the air gap over the interdigital transducer electrode inhibit heat dissipation leading to excessive self-heating.

In FIG. 2, arrows A denote thermal conduction pathways showing how heat is dissipated from the wafer-level package 101. The thermal conduction pathways start at each interdigital transducer electrode 104 where the heat is generated. Since the air gap over the interdigital transducer electrodes 104 inhibits heat transfer, heat flows laterally outwards from each interdigital transducer electrode 104 through the piezoelectric substrate 102 to the point where the copper layer 114 contacts the piezoelectric substrate 102. Heat is conducted up through the copper layer 114 and through the copper terminals 122 and solder bumps 124 to a structure such as a printed circuit board (not shown) to which the wafer-level package is attached. The printed circuit board acts as a heat sink to which heat is dissipated.

However, due to the poor thermal conductivity of lithium niobate and the length and tortuous thermal conduction pathways as denoted by arrows A, heat dissipation from the wafer-level package 101 is not efficient. The heat dissipation efficiency is related to the area of the copper layer 114 which makes contact with the piezoelectric substrate 102, which is typically less than 10% of the overall area of the wafer-level package. These factors can lead to excessive self-heating of the device, which can degrade performance.

SUMMARY

According to one embodiment, there is provided a surface acoustic wave device that includes a piezoelectric substrate, an interdigital transducer electrode on the piezoelectric substrate, a first thermally conductive layer arranged over the piezoelectric substrate and interdigital transducer electrode, and a second thermally conductive layer configured to dissipate heat generated by the surface acoustic wave device. The first thermally conductive layer is spaced apart from the piezoelectric substrate and interdigital transducer electrode.

The second thermally conductive layer is arranged on an opposing side of the piezoelectric substrate to the interdigital transducer electrode.

In one example, the thickness of the second thermally conductive layer may be less than the thickness of the piezoelectric substrate.

In one example, a ratio of the thickness of the piezoelectric substrate to the thickness of the second thermally conductive layer may be in a range from 1.6:1 to 5:1.

In one example, a ratio of the thickness of the piezoelectric substrate to the thickness of the second thermally conductive layer may be in a range from 2:1 to 3.5:1.

In one example, the thickness of the second thermally conductive layer may be in a range from 10 microns to 90 microns.

In one example, the thickness of the second thermally conductive layer may be in a range from 30 microns to 70 microns.

In one example, the thickness of the second thermally conductive layer may be in a range from 40 microns to 60 microns.

In one example, the thickness of the piezoelectric substrate may be less than 300 microns. In one example, the thermal conductivity of the second thermally conductive layer may be at least 10 times the thermal conductivity of the piezoelectric substrate.

In one example, the thermal conductivity of the second thermally conductive layer may be greater than 50 W/mK. The thermal conductivity of the second thermally conductive layer may be greater than 100 W/mK. The thermal conductivity of the second thermally conductive layer may be greater than 200 W/mK. The thermal conductivity of the second thermally conductive layer may be greater than 300 W/mK.

The thermal conductivity of the second thermally conductive layer may be between 50 W/mK and 450 W/mK. The thermal conductivity of the second thermally conductive layer may be between 100 W/mK and 450 W/mK. The thermal conductivity of the second thermally conductive layer may be between 200 W/mK and 450 W/mK. The thermal conductivity of the second thermally conductive layer may be between 300 W/mK and 450 W/mK.

In one example, the second thermally conductive layer may comprise a metal or metal alloy including one or more of aluminum, copper, silver, gold, or tungsten.

In one example, the first thermally conductive layer may be thermally connected to the piezoelectric substrate to provide a thermal conduction pathway between the piezoelectric substrate and the first thermally conductive layer.

In one example, the first thermally conductive layer may be thermally connected to the piezoelectric substrate by a conductive via.

In one example, the interdigital transducer electrode may be formed from an interdigital transducer electrode layer and the conductive via thermally connects the interdigital transducer electrode layer to the first thermally conductive layer.

In one example, the conductive via may electrically connect the interdigital transducer electrode layer to the first thermally conductive layer.

In one example, the second thermally conductive layer may be electrically isolated from the interdigital transducer electrode layer.

In one example, the first thermally conductive layer may comprise copper.

In one example, the surface acoustic wave device may further include a temperature compensation layer. The temperature compensation layer may be over and in physical contact with the interdigital transducer electrode.

In one example, the piezoelectric substrate may have a negative temperature coefficient of frequency. The temperature compensation layer may have a positive temperature coefficient of frequency.

In one example, the temperature compensation layer may include silicon dioxide.

According to another embodiment, there is provided a wafer-level package that includes a piezoelectric substrate, an interdigital transducer electrode on the piezoelectric substrate, a first thermally conductive layer arranged over the piezoelectric substrate and interdigital transducer electrode, and a second thermally conductive layer configured to dissipate heat generated by the surface acoustic wave device. The first thermally conductive layer is spaced apart from the piezoelectric substrate and interdigital transducer electrode. The second thermally conductive layer is arranged on an opposing side of the piezoelectric substrate to the interdigital transducer electrode.

According to another embodiment, there is provided a radio frequency module that includes a power amplifier configured to provide a radio frequency signal and a surface acoustic wave filter configured to filter the radio frequency signal. The surface acoustic wave filter includes a piezoelectric substrate, an interdigital transducer electrode on the piezoelectric substrate, a first thermally conductive layer arranged over the piezoelectric substrate and interdigital transducer electrode, and a second thermally conductive layer configured to dissipate heat generated by the surface acoustic wave device. The first thermally conductive layer is spaced apart from the piezoelectric substrate and interdigital transducer electrode. The second thermally conductive layer is arranged on an opposing side of the piezoelectric substrate to the interdigital transducer electrode.

According to another embodiment, there is provided a wireless communication device that includes a surface acoustic wave filter configured to provide a filtered radio frequency signal. The surface acoustic wave filter includes a piezoelectric substrate, an interdigital transducer electrode on the piezoelectric substrate, a first thermally conductive layer arranged over the piezoelectric substrate and interdigital transducer electrode, and a second thermally conductive layer configured to dissipate heat generated by the surface acoustic wave device. The first thermally conductive layer is spaced apart from the piezoelectric substrate and interdigital transducer electrode. The second thermally conductive layer is arranged on an opposing side of the piezoelectric substrate to the interdigital transducer electrode.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Aspects and embodiments described herein are directed to a SAW device having an additional thermally conductive layer arranged on an opposing side of a piezoelectric substrate to an interdigital transducer electrode. The thermally conductive layer helps to dissipate heat generated by the SAW device by spreading heat over an area of the SAW device and by transferring the heat to a heat sink such as the surrounding environment. The whole area of the SAW is used to propagate the heat flow. Due to the larger area utilized for the propagation of heat flow, the heat dissipation efficiency is improved. This helps to reduce the accumulation of heat around the interdigital transducer electrode and to improve the power durability of the device.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Surface acoustic wave devices such as surface acoustic wave filters used in radio frequency modules and mobile communication devices usually have high power durability requirements, particularly surface acoustic wave filters used in the transmitter band. A key parameter of high power durability is the ability of the device to dissipate heat. If a surface acoustic wave device has insufficient heat dissipation, heat will usually accumulate on some parts of the interdigital transducer electrodes and cause deformation or damage to the electrodes which will greatly influence the filter performance.

Many applications, including fifth generation (5G) mobile handsets, are requiring higher and higher power operation. It would therefore be desirable to be able to provide surface acoustic wave devices that are able to meet the increasing power durability requirements.

Figure 3:
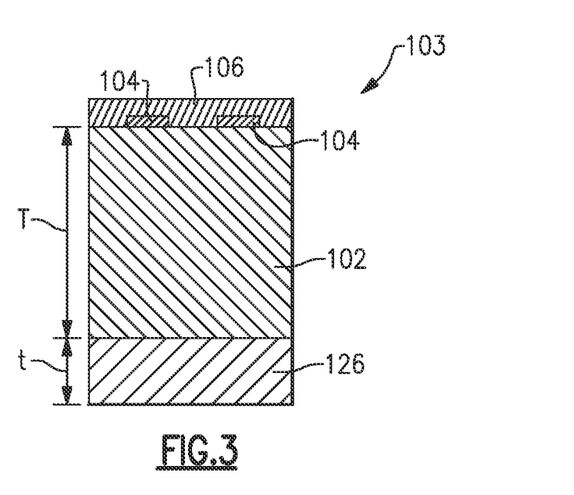
FIG. 3 is a side cross-sectional view of a portion of a TC-SAW device according to an embodiment.

FIG. 3 shows a side cross-sectional view of a portion of a TC-SAW device 103. The TC-SAW device 103 includes a piezoelectric substrate 102 and an interdigital transducer electrode 104 arranged on an upper surface of the piezoelectric substrate 102. The piezoelectric substrate 102 can be any suitable piezoelectric material, such as a lithium niobate (LN) or lithium tantalate (LT). The piezoelectric substrate 102 may have any suitable thickness T in a direction perpendicular to the upper and lower planar surfaces of the piezoelectric substrate 102. For example, the piezoelectric substrate 102 may have a thickness T from 110 microns to 150 microns. In the embodiment of FIG. 3, the piezoelectric substrate 102 has a thickness T of 130 microns.

The interdigital transducer electrode 104 can include aluminum (Al) or any suitable alloy thereof. The interdigital transducer electrode 104 can include two or more conductive layers in some instances. Such an interdigital transducer electrode 104 can include aluminum (Al) and another conductive layer such as molybdenum (Mo), tungsten (W), gold (Au), silver (Ag), copper (Cu), platinum (Pt), ruthenium (Ru), titanium (Ti), or a combination or alloy of two or more of these materials.

A temperature-compensation layer 106 is arranged over, and in contact with, the piezoelectric substrate 102 and interdigital transducer electrode 104. The temperature compensation layer 106 has a temperature coefficient of frequency which is opposite to that of the piezoelectric substrate 102. In the embodiment of FIG. 3, the piezoelectric substrate 102 has a negative temperature coefficient of frequency and the temperature compensation layer 106 has a positive temperature coefficient of frequency. Therefore, the temperature compensation layer 106 tends to oppose any change in frequency caused by a change in temperature of the TC-SAW device 103.

The temperature compensation layer 106 can be a silicon dioxide ($SiO_2$) layer, or any other suitable temperature compensation layer. The temperature compensation layer 106 can be a layer of any other suitable material having a positive temperature coefficient of frequency. For instance, the temperature compensation layer 106 can be a tellurium dioxide ($TeO_2$) layer or a silicon oxyfluoride (SiOF) layer in certain applications. The temperature compensation layer 106 can include any suitable combination of $SiO_2$, $TeO_2$, and/or SiOF. The temperature compensation layer 106 can be a passivation layer, in some applications.

Figure 4:
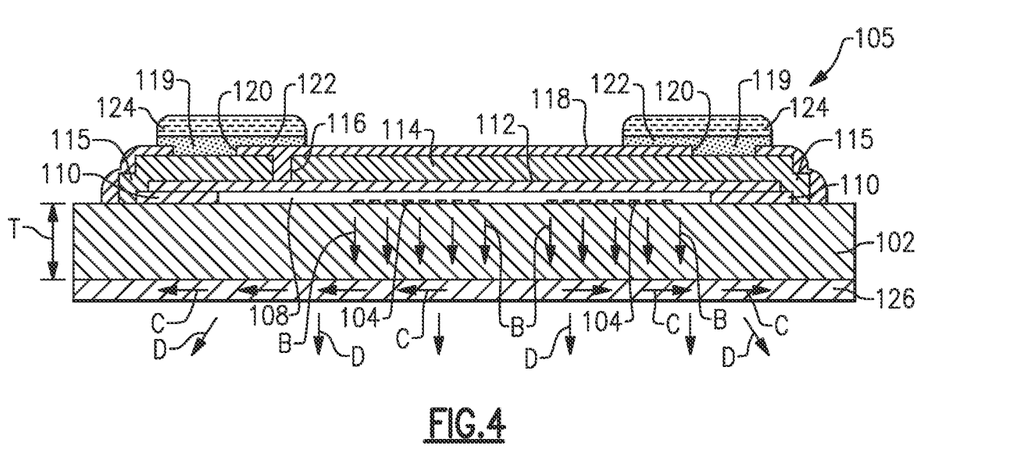
FIG. 4 is a side cross-sectional view of a wafer-level package including a SAW device according to an embodiment.

A thermally conductive layer 126 is arranged on a lower surface of the piezoelectric substrate 102. The thermally conductive layer 126 is a second thermally conductive layer. For clarity, a first thermally conductive layer arranged over, and spaced apart from, the piezoelectric substrate and interdigital transducer electrode has been omitted from FIG. 3. However, a first thermally conductive layer is shown in the embodiment of FIG. 4, as discussed further below. The thermally conductive layer 126 is arranged on an opposing side of the piezoelectric substrate 102 to the interdigital transducer electrode 104. The thermally conductive layer 126 may include any suitably thermally conductive material such as one or more of aluminum, copper, silver, gold and tungsten. The thermal conductivity of the thermally conductive layer 126 is greater than 50 W/mK, preferably greater than 100 W/mK, more preferably greater than 200 W/mK, and yet preferably greater than 300 W/mK. In the embodiment of FIG. 3 the thermally conductive layer 126 is made from copper. The thermally conductive layer 126 may have any suitable thickness tin a direction perpendicular to the upper and lower planar surfaces of the piezoelectric substrate 102. For example, the thermally conductive layer 126 may have a thickness t from 10 microns to 90 microns. A suitable thickness for the thermally conductive layer 126 is discussed below with reference to FIG. 7.

The thermally conductive layer 126 is configured to dissipate heat generated by the TC-SAW device 103. Heat generated in the region of the interdigital transducer electrode 104 can pass directly through the thickness T of the piezoelectric substrate 102 to the thermally conductive layer 126 from where it can be dissipated to the environment and spread out over substantially the whole area of the thermally conductive layer 126. This improves the power durability of the TC-SAW device 103 by improving the ability to conduct heat away from the interdigital transducer electrode 104 and out of the TC-SAW device 103, thereby lowering the temperature in the region of the interdigital transducer electrode 104 even when the total amount of dissipated power has not been decreased.

FIG. 4 is a side cross-sectional view of a wafer-level package 105. The wafer-level package 105 can include a SAW or TC-SAW device. The wafer-level package 105 includes a piezoelectric substrate 102 and a plurality of interdigital transducer electrodes 104 arranged on an upper surface of the piezoelectric substrate 102. The piezoelectric substrate 102 and interdigital transducer electrodes 104 of wafer-level package 105 have the same characteristics as the piezoelectric substrate 102 and interdigital transducer electrodes 104 of the embodiment of FIG. 3, which for conciseness are not repeated here. If the wafer-level package 105 includes a TC-SAW device, a temperature compensation layer (not shown) would be arranged over, and in contact with, the piezoelectric substrate 102 and interdigital transducer electrodes 104, as shown in FIG. 3.

The interdigital transducer electrodes 104 are accommodated within a cavity 108 defined by a cavity wall 110 and a cavity roof 112. The cavity wall 110 is formed on the piezoelectric substrate 102 and encloses an area of the piezoelectric substrate 102 on which the interdigital transducer electrodes 104 and other circuit structures (not shown) are formed. The cavity roof 112 is arranged over the piezoelectric substrate 102 and interdigital transducer electrodes 104 and is supported by the cavity wall 110 such that it is spaced apart from the piezoelectric substrate 102 and interdigital transducer electrodes 104 to create an air gap between the interdigital transducer electrodes 104 and the cavity roof 112.

The cavity wall 110 is formed from the same material as the cavity roof 112. The cavity wall 110 and cavity roof 112 can include any suitable polymer or dielectric material such as polyimide film. Preferably, the material from which the cavity wall 110 and cavity roof 112 are made is photo-definable. The cavity wall 110 is formed by dry film stretching a layer of photo-definable polymer over the piezoelectric substrate 102 and interdigital transducer electrodes 104. A pattern of the cavity wall 110 is then applied to the polymer layer by exposure to ultraviolet light and the unwanted parts of the pattern are removed by a suitable etching process to leave the cavity wall 110 which extends continuously around the area on which the interdigital transducer electrodes 104 and circuit structures (not shown) are formed. The cavity roof 112 is then dry film stretched over the cavity wall 110.

A first thermally conductive layer 114 is arranged over the cavity roof 112 and cavity wall 110. The first thermally conductive layer 114 can include any metal with suitable electrical conductivity such as copper, aluminum, silver, or gold or an alloy of these metals. The first thermally conductive layer 114 provides mechanical support for the cavity roof 112. The outer parts of the first thermally conductive layer 114 extend down to contact the piezoelectric substrate 102 outside the cavity wall 110 to form thermally conductive vias 115 that provide thermal conduction pathways from the piezoelectric substrate 102 to the first thermally conductive layer 114.

The interdigital transducer electrodes 104 are formed from an interdigital transducer electrode layer (not shown) which is patterned to form the interdigital transducer electrodes 104. Parts of the interdigital transducer electrode layer extends outside of the cavity wall 110 to allow electrical connection to the interdigital transducer electrodes 104. Outer parts of the first thermally conductive layer 114 may also extend down to make contact with the parts of the interdigital transducer electrode layer and other circuit structures (not shown), which extend outside of the cavity wall 110. The first thermally conductive layer 114 is patterned by removing portions of the first thermally conductive layer 114 to form gaps 116 in the first thermally conductive layer 114 so as to provide specific interconnection pathways between the interdigital transducer electrodes 104 and other circuit structures. The first thermally conductive layer 114 therefore also acts as a redistribution layer providing electrical interconnection between different components of the wafer-level package 105.

A dielectric layer 118 is arranged over the first thermally conductive layer 114. The dielectric layer 118 hermetically seals the wafer-level package 105. The dielectric layer 118 can include any suitable polymeric or dielectric material such as polyimide. Preferably, the dielectric layer 118 is photo-definable. Via holes 120 are formed in the dielectric layer 118 which are occupied by electrically conductive vias 119 to provide electrical connection between the first thermally conductive layer 114 and contact terminals 122 formed over the dielectric layer 118. The vias 119 and contact terminals 122 are formed from any suitable electrically conductive material such as copper. Flattened solder bumps or balls 124 are arranged on the contact terminals 122 and are used to electrically connect the wafer-level package 105 to a printed circuit board (not shown).

A second thermally conductive layer 126 is arranged on a lower surface of the piezoelectric substrate 102. The second thermally conductive layer 126 is arranged on an opposing side of the piezoelectric substrate 102 to the interdigital transducer electrodes 104. The second thermally conductive layer 126 is in contact with, and covers substantially the entire surface area of, the lower surface of the piezoelectric substrate 102. The second thermally conductive layer 126 has the same characteristics as the thermally conductive layer 126 of the embodiment of FIG. 3, which for conciseness are not repeated here.

The second thermally conductive layer 126 is configured to dissipate heat generated by the wafer-level package 105. Heat generated in the region of the interdigital transducer electrodes 104 can pass directly through the thickness T of the piezoelectric substrate 102 to the second thermally conductive layer 126, as denoted by arrows B in FIG. 4. When heat reaches the second thermally conductive layer 126 it can easily spread through the thermally conductive material of the second thermally conductive layer 126, as denoted by arrows C in FIG. 4, such that heat is distributed over substantially the whole area of the second thermally conductive layer 126. Heat is then dissipated from the second thermally conductive layer 126 to the environment, as denoted by arrows D in FIG. 4.

In the embodiment of FIG. 4, heat can still be dissipated from the wafer-level package 105 via the heat conduction pathway provided by the thermally conductive vias 115 and first thermally conductive layer 114 in a similar way to which heat is dissipated in the arrangement of FIG. 2 (see thermal conduction pathway denoted by arrows A in FIG. 2). However, the thermal dissipation pathway provided by the second thermally conductive layer 126, as denoted by arrows B, C and D, provides an additional and significantly improved thermal pathway for dissipating heat. Furthermore, the whole area of the wafer-level package 105 can be used to dissipate heat. This improves the power durability of the wafer-level package 105 by improving the ability to conduct heat away from the interdigital transducer electrodes 104 and out of wafer-level package 105, thereby lowering the temperature in the region of the interdigital transducer electrodes 104 even when the total amount of dissipated power has not been decreased.

Figure 5:
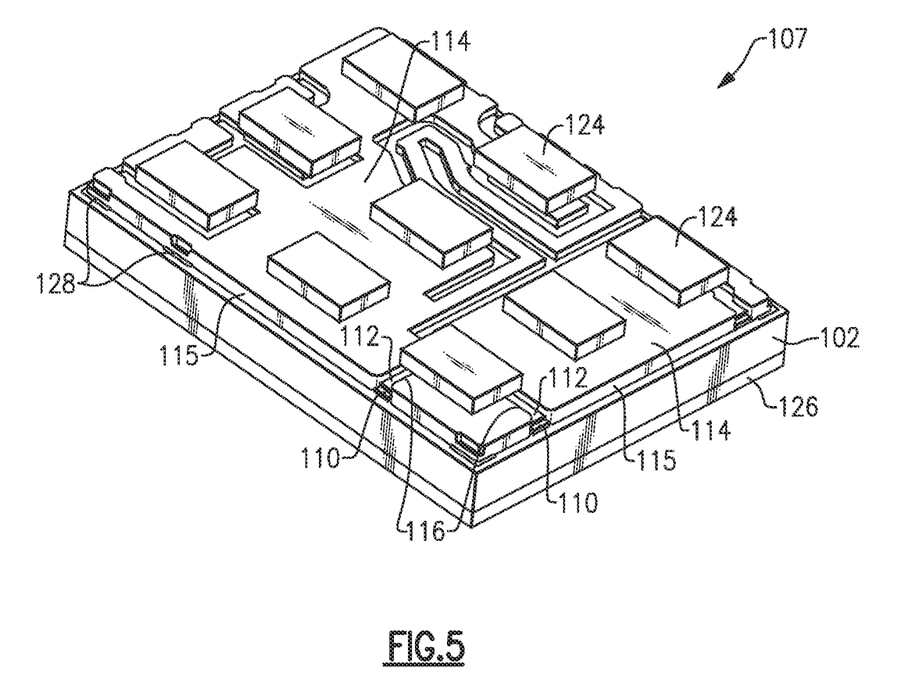
FIG. 5 is a perspective view of a wafer-level package including a SAW device according to another embodiment.

FIG. 5 is a perspective view of a wafer-level package 107. The wafer-level package 107 can include a SAW or TC-SAW device and has a similar construction to the wafer-level package 105 shown in FIG. 4. The wafer-level package 105 includes a piezoelectric substrate 102 and a plurality of interdigital transducer electrodes (not shown) arranged on an upper surface of the piezoelectric substrate 102. A cavity wall 110 is provided near to and around the perimeter of the piezoelectric substrate 102. The cavity wall 110 supports a cavity roof 112, which is arranged over, and spaced apart from, the piezoelectric substrate 102 and interdigital transducer electrodes 104.

A first thermally conductive layer 114 is arranged over the cavity roof 112 and cavity wall 110. The outer parts of the first thermally conductive layer 114 extend down to contact the piezoelectric substrate 102 outside the cavity wall 110 to form thermally conductive vias 115 that provide thermal conduction pathways from the piezoelectric substrate 102 to the first thermally conductive layer 114. Parts of an interdigital transducer electrode layer 128, from which the interdigital transducer electrodes (not shown) and other circuit structures (not shown) are formed, extend outside of the cavity wall 110 to allow for electrical connection. Outer parts of the first thermally conductive layer 114 also extend down to make contact with the parts of the interdigital transducer electrode layer 128 that extend outside of the cavity wall 110.

The first thermally conductive layer 114 is patterned by removing portions of the first thermally conductive layer 114 to form gaps 116 between different sections of the first thermally conductive layer 114 so as to provide specific interconnection pathways between the interdigital transducer electrodes 104 and other circuit structures. A dielectric layer (not shown) is arranged over the first thermally conductive layer 114 but has been omitted from FIG. 5 for the purposes of clarity. Solder bumps 124 are arranged over the first thermally conductive layer 114 for connecting the wafer-level package 107 to a printed circuit board (not shown). The solder bumps 124 are electrically connected to different sections of the first thermally conductive layer 114.

A second thermally conductive layer 126 is arranged on a lower surface of the piezoelectric substrate 102, that is, on an opposing side of the piezoelectric substrate 102 to the interdigital transducer electrodes 104. The second thermally conductive layer 126 is in contact with, and covers substantially the entire surface area of, the lower surface of the piezoelectric substrate 102.

The various components of the wafer-level package 107 described above have the same characteristics as the corresponding components in the embodiment of FIG. 4 and are not repeated here in the interests of conciseness.

Figure 6A:
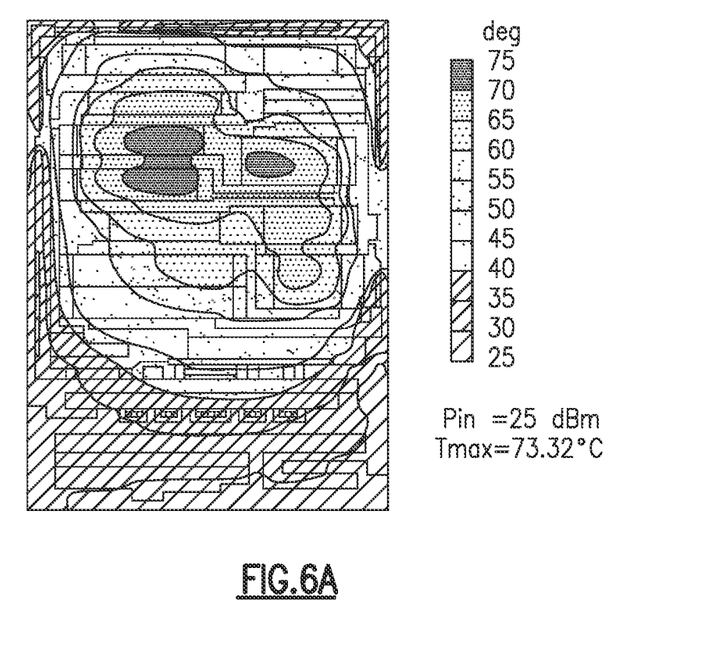
FIG. 6A is a simulated heat map of an exemplary conventional SAW device having a single thermally conductive layer.

FIG. 6A is a simulated heat map of a conventional SAW device. The simulation includes a surface acoustic wave device similar to the wafer-level package of FIG. 2 and only has a single thermally conductive layer arranged over the piezoelectric substrate and interdigital transducer electrodes. The simulation in FIG. 6A corresponds to an input power of 25 dBm and an ambient temperature of 25.86 degrees centigrade. As shown in the heat map of FIG. 6A, the maximum temperature of the surface acoustic wave device was 73.32 degrees centigrade.

Figure 6B:
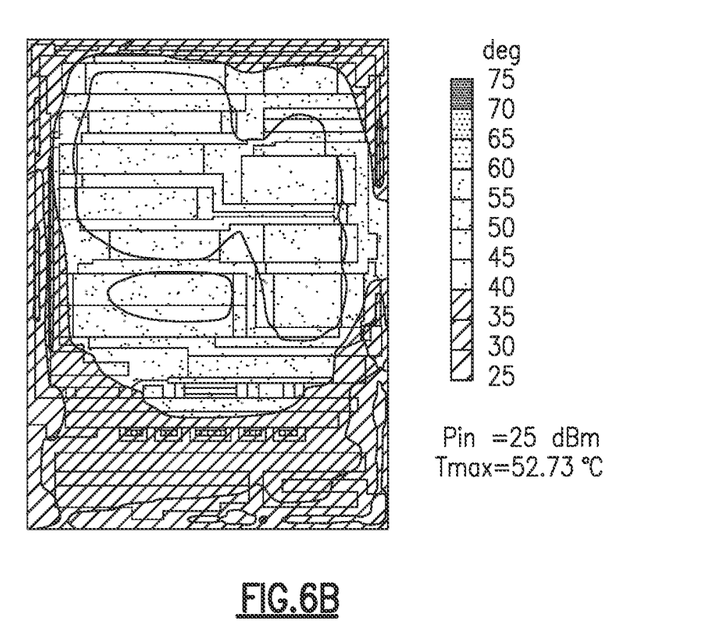
FIG. 6B is a simulated heat map of a SAW device having a second thermally conductive layer according to an embodiment.

FIG. 6B is a simulated heat map of another SAW device. The simulation includes a surface acoustic wave device similar to the wafer-level package of FIG. 4 and has both a first thermally conductive layer arranged over the piezoelectric substrate and interdigital transducer electrodes and a second thermally conductive layer arranged on an opposing side of the piezoelectric substrate to the interdigital transducer electrodes. The simulation in FIG. 6B corresponds to an input power of 25 dBm and an ambient temperature of 25.80 degrees centigrade. The thickness of the second thermally conductive layer in the simulation of FIG. 6B is 50 microns. As shown in the heat map of FIG. 6B, the maximum temperature of the surface acoustic wave device was 52.73 degrees centigrade. This is a considerable reduction in maximum temperature compared to the simulation in FIG. 6A which only had a single thermally conductive layer and shows that providing a second thermally conductive layer on an opposing side of the piezoelectric substrate to the interdigital transducer electrodes significantly improves thermal dissipation from the surface acoustic wave device.

Figure 7:
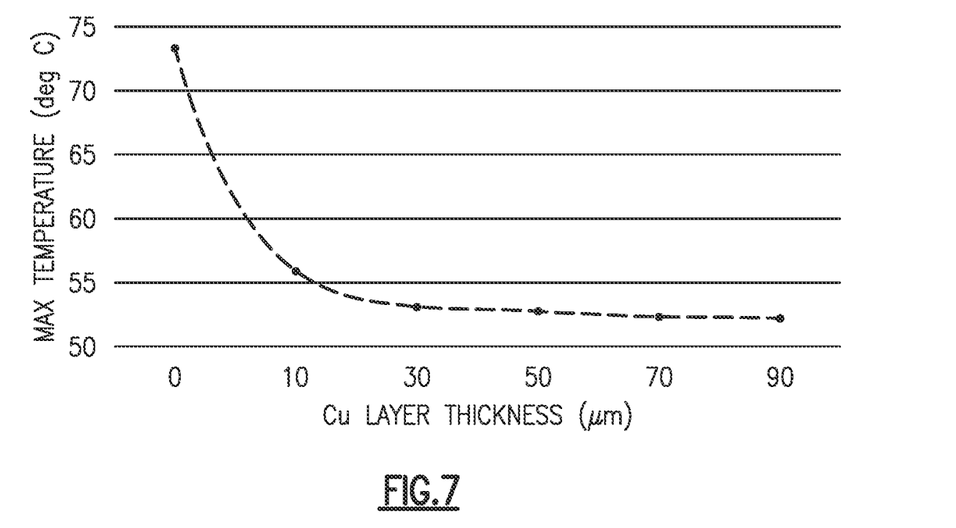
FIG. 7 is a graph illustrating a relationship between simulated maximum temperature of an interdigital transducer electrode of a SAW device and thickness of a second thermally conductive layer.

FIG. 7 is a graph illustrating a relationship between simulated maximum temperature of an interdigital transducer electrode of a SAW device and thickness of a second thermally conductive layer. The graph shows that when the thickness of the second thermally conductive layer is zero, that is, a second thermally conductive layer is not provided, the maximum temperature of the interdigital transducer electrode of the SAW device was 73.3 degrees centigrade. This corresponds to the simulation in FIG. 6A. With the addition of a second thermally conductive layer, the maximum temperature of the interdigital transducer electrode decreases rapidly initially until the thickness of the second thermally conductive layer reaches approximately 10 microns. Once the thickness of the second thermally conductive layer increases beyond 30 microns, the rate of reduction in maximum temperature of the interdigital transducer electrode is significantly reduced. When producing SAW and TC-SAW devices, the heat dissipation benefits of adding a second thermally conductive layer need to be balanced against increased material and manufacturing costs. Therefore, a suitable thickness of the second thermally conductive layer has been found to be in the range from 30 microns to 70 microns. However, it will be appreciated that other thickness ranges could be used.

Surface acoustic wave devices can be included in a filter. A filter that includes one or more surface acoustic wave devices can be referred to as a surface acoustic wave filter. Surface acoustic wave devices can be arranged as series resonators and shunt resonators to form a ladder filter. In some instances, a filter can include surface acoustic wave resonators and one or more other resonators (e.g., one or more other bulk acoustic wave resonators).

Figure 8:
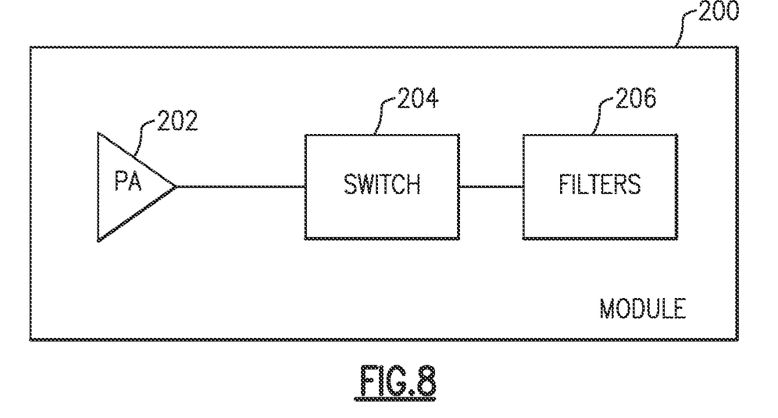
FIG. 8 is a schematic block diagram of a module that includes a power amplifier, a switch, and filters in accordance with one or more embodiments.
Figure 9:
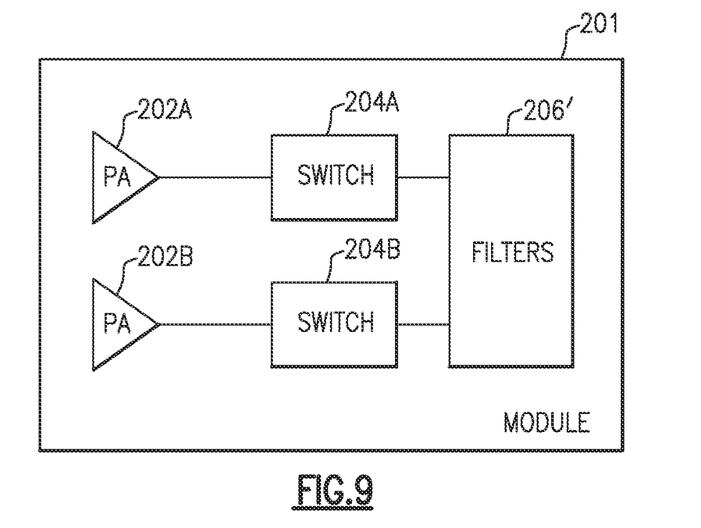
FIG. 9 is a schematic block diagram of a module that includes power amplifiers, switches, and filters in accordance with one or more embodiments.
Figure 10:
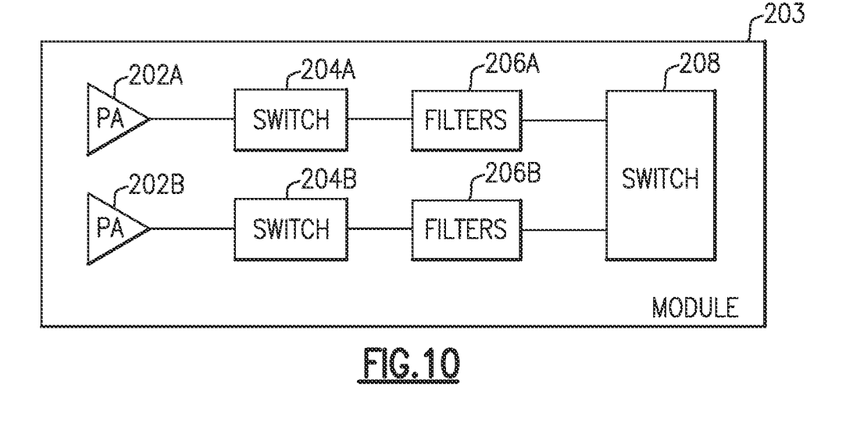
FIG. 10 is a schematic block diagram of a module that includes power amplifiers, switches, filters in accordance with one or more embodiments, and an antenna switch.

The filters discussed herein can be implemented in a variety of modules. Some example modules will now be discussed in which any suitable principles and advantages of the filters discussed herein can be implemented. FIGS. 8, 9, and 10 are schematic block diagrams of illustrative modules according to certain embodiments. A module arranged to process a radio frequency signal can be referred to as a radio frequency (RF) module.

FIG. 8 is a schematic block diagram of a module 200 that includes a power amplifier 202, a switch 204, and filters 206 in accordance with one or more embodiments. The module 200 can include a package that encloses the illustrated elements. The power amplifier 202, the switch 204, and the filters 206 can be disposed on a common packaging substrate. The packaging substrate can be a laminate substrate, for example. The power amplifier 202 can amplify a radio frequency signal. The power amplifier 202 can include a gallium arsenide bipolar transistor in certain applications. The switch 204 can be a multi-throw radio frequency switch. The switch 204 can electrically couple an output of the power amplifier 202 to a selected filter of the filters 206. The filters 206 can include any suitable number of surface acoustic wave filters and/or other acoustic wave filters. One or more of the surface acoustic wave filters of the filters 206 can be implemented in accordance with any suitable principles and advantages of the surface acoustic wave devices discussed herein.

FIG. 9 is a schematic block diagram of a module 201 that includes power amplifiers 202A and 202B, switches 204A and 204B, and filters 206' in accordance with one or more embodiments. The module 201 is like the module 200 of FIG. 8, except that the module 201 includes an additional power amplifier 202B and an additional switch 204B and the filters 206' are arranged to filter signals for the signals paths associated with a plurality of power amplifiers 202A and 202B. The different signal paths can be associated with different frequency bands and/or different modes of operation (e.g. different power modes, different signaling modes, etc.).

FIG. 10 is a schematic block diagram of a module 203 that includes power amplifiers 202A and 202B, switches 204A and 204B, and filters 206A and 206B in accordance with one or more embodiments, and an antenna switch 208. The module 203 is like the module 201 of FIG. 9, except the module 203 includes an antenna switch 208 arranged to selectively couple a signal from the filters 206A or the filters 206B to an antenna node. The filters 206A and 206B can correspond to the filters 206' of FIG. 9.

Figure 11:
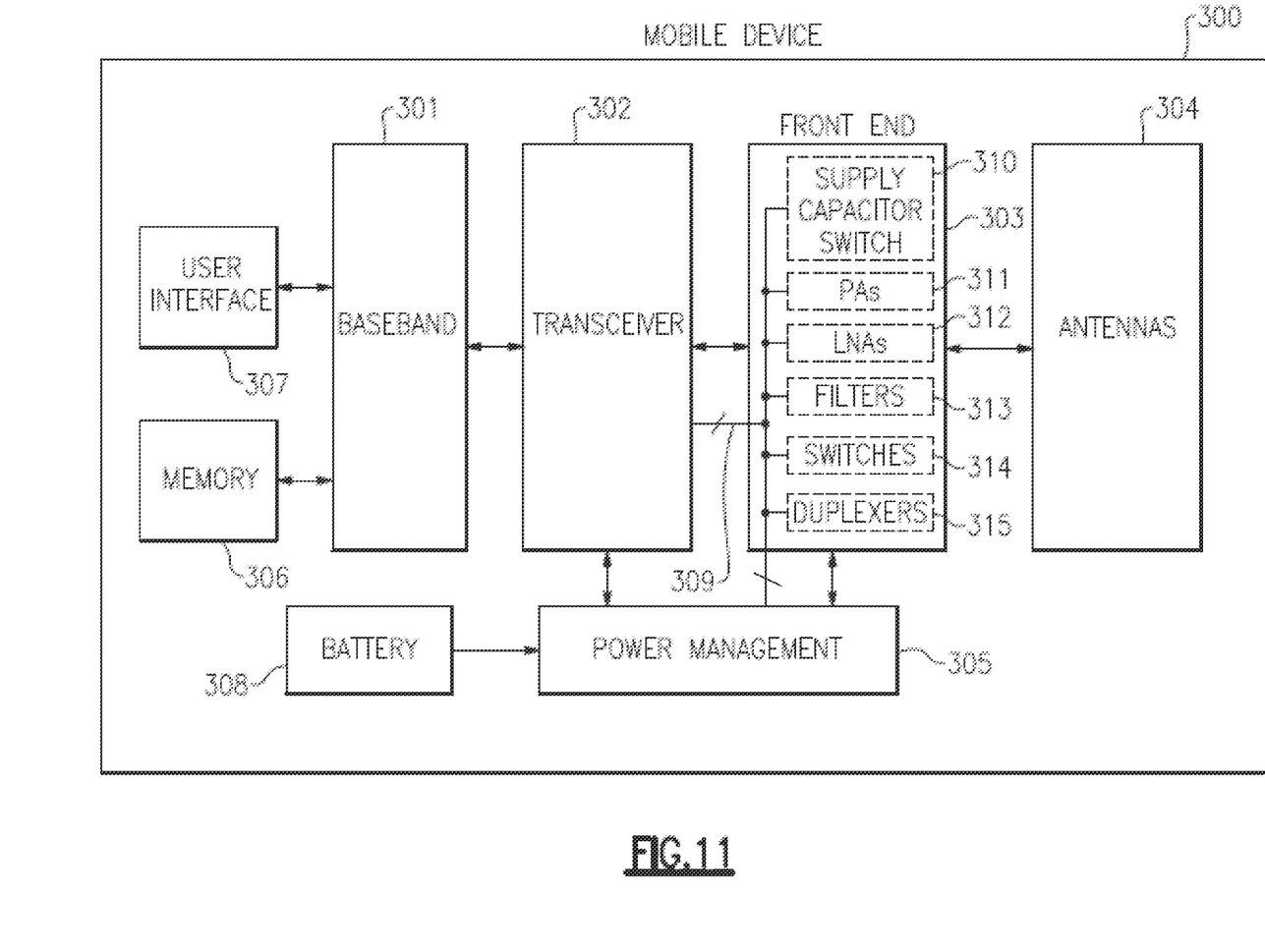
FIG. 11 is a schematic diagram of one embodiment of a wireless communication device.

FIG. 11 is a schematic diagram of one embodiment of a wireless communication device or mobile device 300. The mobile device 300 includes a baseband system 301, a transceiver 302, a front end system 303, antennas 304, a power management system 305, a memory 306, a user interface 307, and a battery 308.

Although the mobile device 300 illustrates one example of an RF system that can include one or more features of the present disclosure, the teachings herein are applicable to electronic systems implemented in a wide variety of ways.

The mobile device 300 can be used to communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMax), and/or GPS technologies.

The transceiver 302 generates RF signals for transmission and processes incoming RF signals received from the antennas 304. It will be understood that various functionalities associated with the transmission and receiving of RF signals can be achieved by one or more components that are collectively represented in FIG. 11 as the transceiver 302. In one example, separate components (for instance, separate circuits or dies) can be provided for handling certain types of RF signals.

As shown in in FIG. 11, the transceiver 302 is connected to the front end system 303 and to the power management circuit 305 using a serial interface 309. All or part of the illustrated RF components can be controlled by the serial interface 309 to configure the mobile device 300 during initialization and/or while fully operational. In another embodiment, the baseband processor 301 is additionally or alternative connected to the serial interface 309 and operates to configure one or more RF components, such as components of the front end system 303 and/or power management system 305.

The front end system 303 aids in conditioning signals transmitted to and/or received from the antennas 304. In the illustrated embodiment, the front end system 303 includes one or more bias control circuits 310 for controlling power amplifier biasing, one or more power amplifiers (PAs) 311, one or more low noise amplifiers (LNAs) 312, one or more filters 313, one or more switches 314, and one or more duplexers 315. However, other implementations are possible.

For example, the front end system 303 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 300 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 304 can include antennas used for a wide variety of types of communications. For example, the antennas 304 can include antennas for transmitting and/or receiving signals associated with a wide variety of frequencies and communications standards.

In certain implementations, the antennas 304 support multiple-input and multiple-output (MIMO) communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 300 can operate with beamforming in certain implementations. For example, the front end system 303 can include phase shifters having variable phase controlled by the transceiver 302. Additionally, the phase shifters are controlled to provide beam formation and directivity for transmission and/or reception of signals using the antennas 304. For example, in the context of signal transmission, the phases of the transmit signals provided to the antennas 304 are controlled such that radiated signals from the antennas 304 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 304 from a particular direction. In certain implementations, the antennas 304 include one or more arrays of antenna elements to enhance beamforming.

The baseband system 301 is coupled to the user interface 307 to facilitate processing of various user input and output (I/O), such as voice and data. The baseband system 301 provides the transceiver 302 with digital representations of transmit signals, which the transceiver 302 processes to generate RF signals for transmission. The baseband system 301 also processes digital representations of received signals provided by the transceiver 302. As shown in FIG. 11, the baseband system 301 is coupled to the memory 306 to facilitate operation of the mobile device 300.

The memory 306 can be used for a wide variety of purposes, such as storing data and/or instructions to facilitate the operation of the mobile device 300 and/or to provide storage of user information.

The power management system 305 provides a number of power management functions of the mobile device 300. In certain implementations, the power management system 305 includes a power amplifier (PA) supply control circuit that controls the supply voltages of the power amplifiers 311. For example, the power management system 305 can be configured to change the supply voltage(s) provided to one or more of the power amplifiers 311 to improve efficiency, such as power added efficiency (PAE).

The power management system 305 can operate in a selectable supply control mode, such an average power tracking (APT) mode or an envelope tracking (ET) mode. In the illustrated embodiment, the selected supply control mode of the power management system 305 is controlled by the transceiver 302. In certain implementations, the transceiver 302 controls the selected supply control mode using the serial interface 309.

As shown in FIG. 11, the power management system 305 receives a battery voltage from the battery 308. The battery 308 can be any suitable battery for use in the mobile device 300, including, for example, a lithium-ion battery. Although the power management system 305 is illustrated as separate from the front end system 303, in certain implementations all or part (for instance, a PA supply control circuit) of the power management system 305 is integrated into the front end system 303.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

The invention claimed is:

1. A surface acoustic wave device comprising:
   a piezoelectric substrate;
   an interdigital transducer electrode on the piezoelectric substrate;
   a first thermally conductive layer arranged over the piezoelectric substrate and the interdigital transducer electrode, the first thermally conductive layer being spaced apart from the piezoelectric substrate and the interdigital transducer electrode; and
   a second thermally conductive layer configured to dissipate heat generated by the surface acoustic wave device, the second thermally conductive layer being arranged on an opposing side of the piezoelectric substrate to the interdigital transducer electrode.

2. The surface acoustic wave device of claim 1 wherein a thickness of the second thermally conductive layer is less than a thickness of the piezoelectric substrate.

3. The surface acoustic wave device of claim 1 wherein a ratio of a thickness of the piezoelectric substrate to a thickness of the second thermally conductive layer is in a range from 1.6:1 to 5:1.

4. The surface acoustic wave device of claim 3 wherein a ratio of the thickness of the piezoelectric substrate to the thickness of the second thermally conductive layer is in a range from 2:1 to 3.5:1.

5. The surface acoustic wave device of claim 1 wherein a thickness of the second thermally conductive layer is in a range from 10 microns to 90 microns.

6. The surface acoustic wave device of claim 5 wherein the thickness of the second thermally conductive layer is in a range from 30 microns to 70 microns.

7. The surface acoustic wave device of claim 6 wherein the thickness of the second thermally conductive layer is in a range from 40 microns to 60 microns.

8. The surface acoustic wave device of claim 1 wherein a thickness of the piezoelectric substrate is less than 300 microns.

9. The surface acoustic wave device of claim 1 wherein a thermal conductivity of the second thermally conductive layer is at least 10 times a thermal conductivity of the piezoelectric substrate.

10. The surface acoustic wave device of claim 1 wherein a thermal conductivity of the second thermally conductive layer is greater than 50 W/mK.

11. The surface acoustic wave device of claim 10 wherein the thermal conductivity of the second thermally conductive layer is greater than 100 W/mK.

12. The surface acoustic wave device of claim 11 wherein the thermal conductivity of the second thermally conductive layer is greater than 200 W/mK.

13. The surface acoustic wave device of claim 12 wherein the thermal conductivity of the second thermally conductive layer is greater than 300 W/mK.

14. The surface acoustic wave device of claim 1 wherein the second thermally conductive layer comprises a metal or metal alloy including one or more of aluminum, copper, silver, gold, or tungsten.

15. The surface acoustic wave device of claim 1 wherein the first thermally conductive layer is thermally connected to the piezoelectric substrate to provide a thermal conduction pathway between the piezoelectric substrate and the first thermally conductive layer.

16. The surface acoustic wave device of claim 15 wherein the first thermally conductive layer is thermally connected to the piezoelectric substrate by a conductive via.

17. The surface acoustic wave device of claim 16 wherein the interdigital transducer electrode is formed from an interdigital transducer electrode layer and the conductive via thermally connects the interdigital transducer electrode layer to the first thermally conductive layer.

18. The surface acoustic wave device of claim 17 wherein the conductive via electrically connects the interdigital transducer electrode layer to the first thermally conductive layer.

19. The surface acoustic wave device of claim 17 wherein the second thermally conductive layer is electrically isolated from the interdigital transducer electrode layer.

20. The surface acoustic wave device of claim 1 wherein the first thermally conductive layer comprises copper.

21. The surface acoustic wave device of claim 1 further comprising a temperature compensation layer over and in physical contact with the interdigital transducer electrode.

22. The surface acoustic wave device of claim 21 wherein the piezoelectric substrate has a negative temperature coefficient of frequency and the temperature compensation layer has a positive temperature coefficient of frequency.

23. The surface acoustic wave device of claim 21 wherein the temperature compensation layer comprises silicon dioxide.

24. A wafer-level package including a surface acoustic wave device comprising: a piezoelectric substrate; an interdigital transducer electrode on the piezoelectric substrate; a first thermally conductive layer arranged over the piezoelectric substrate and the interdigital transducer electrode, the first thermally conductive layer being spaced apart from the piezoelectric substrate and the interdigital transducer electrode; and a second thermally conductive layer configured to dissipate heat generated by the surface acoustic wave device, the second thermally conductive layer being arranged on an opposing side of the piezoelectric substrate to the interdigital transducer electrode.

25. A wireless communication device comprising a surface acoustic wave filter configured to provide a filtered radio frequency signal, the surface acoustic wave filter including a piezoelectric substrate, an interdigital transducer electrode on the piezoelectric substrate, a first thermally conductive layer arranged over the piezoelectric substrate and the interdigital transducer electrode, the first thermally conductive layer being spaced apart from the piezoelectric substrate and the interdigital transducer electrode, and a second thermally conductive layer configured to dissipate heat generated by the surface acoustic wave filter, the second thermally conductive layer being arranged on an opposing side of the piezoelectric substrate to the interdigital transducer electrode.

* * * * *